United States Patent
Chang et al.

(10) Patent No.: US 9,899,798 B2
(45) Date of Patent: Feb. 20, 2018

(54) APPARATUS AND METHOD FOR SUPPRESSING PARASITIC LASING AND APPLICATIONS THEREOF

(71) Applicant: University of Central Florida Research Foundation, Inc., Orlando, FL (US)

(72) Inventors: Zenghu Chang, Oviedo, FL (US); Yi Wu, Orlando, FL (US); Eric Cunningham, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/816,166

(22) Filed: Aug. 3, 2015

(65) Prior Publication Data
US 2017/0040767 A1 Feb. 9, 2017

(51) Int. Cl.
*H01S 3/16* (2006.01)
*H01S 3/04* (2006.01)
(Continued)

(52) U.S. Cl.
CPC ............ *H01S 5/1078* (2013.01); *H01S 3/025* (2013.01); *H01S 3/0405* (2013.01);
(Continued)

(58) Field of Classification Search
CPC .... H01S 3/0602; H01S 5/0226; H01S 5/1078; H01S 3/1625; H01S 3/1633; H01S 3/025; H01S 2301/02
See application file for complete search history.

(56) References Cited

U.S. PATENT DOCUMENTS

| | | | |
|---|---|---|---|
| 3,445,785 A | 5/1969 | Koester et al. | |
| 3,508,165 A | 4/1970 | Nicolai | |

(Continued)

FOREIGN PATENT DOCUMENTS

| | | |
|---|---|---|
| CN | 102148473 A | 8/2011 |
| CN | 102545023 A | 7/2012 |

(Continued)

OTHER PUBLICATIONS

Suppression of parasitic lasing in large-aperature Ti-sapphire laser amplifiers, F.G. Patterson et al., Jul. 15, 1999, vol. 24, No. 14, Optics Letters pp. 963-965.

*Primary Examiner* — Yuanda Zhang
(74) *Attorney, Agent, or Firm* — Bond, Schoeneck & King, PLLC; William Greener; Alek Szecsy

(57) ABSTRACT

Apparatus and methods that enable the suppression of amplified spontaneous emission (ASE) and prevention against parasitic lasing in cryogenically-cooled laser amplifier systems, thus allowing sustainable extraction efficiency when increasing the pump power and suitable for large-scale, high average-power laser systems employing large-aperture gain media. A gain medium having a known index of refraction for operation in an evacuated, cryogenic environment includes an ASE-absorbing epoxy composition on the perimetrical edge of the gain medium, wherein the epoxy composition has an index of refraction that substantially matches the index of refraction of the gain medium.

44 Claims, 2 Drawing Sheets

(51) Int. Cl.
  H01S 5/10    (2006.01)
  H01S 3/02    (2006.01)
  H01S 5/022   (2006.01)
  H01S 3/042       (2006.01)
  H01S 3/06        (2006.01)

(52) U.S. Cl.
  CPC ............ H01S 5/0226 (2013.01); H01S 3/042 (2013.01); H01S 3/061 (2013.01); H01S 3/0604 (2013.01); H01S 3/1625 (2013.01); H01S 3/1636 (2013.01); H01S 2301/02 (2013.01)

(56) References Cited

U.S. PATENT DOCUMENTS

| | | | |
|---|---|---|---|
| 3,904,983 A | 9/1975 | Moreno et al. | |
| 4,173,001 A | 10/1979 | Koepf | |
| 4,849,036 A | 7/1989 | Powell et al. | |
| 4,899,347 A | 2/1990 | Kuchar et al. | |
| 5,441,803 A | 8/1995 | Meissner | |
| 5,508,235 A | 4/1996 | Marker | |
| 5,535,237 A | 7/1996 | LaPadula, III et al. | |
| 5,718,979 A | 2/1998 | Marker et al. | |
| 5,793,012 A | 8/1998 | Ortiz, Jr. | |
| 5,852,622 A | 12/1998 | Meissner et al. | |
| 5,974,061 A | 10/1999 | Byren et al. | |
| 6,171,988 B1 | 1/2001 | Fasano et al. | |
| 6,195,372 B1 | 2/2001 | Brown | |
| 6,436,332 B1 | 8/2002 | Fasano et al. | |
| 6,587,488 B1 | 7/2003 | Meissner et al. | |
| 6,738,399 B1 | 5/2004 | Albrecht et al. | |
| 6,763,050 B2 | 7/2004 | Zapata et al. | |
| 6,792,017 B2 | 9/2004 | Halpin | |
| 6,904,069 B2 | 6/2005 | Honea et al. | |
| 7,085,304 B2 | 8/2006 | Vetrovec | |
| 7,123,634 B2 | 10/2006 | Rothenberg et al. | |
| 7,200,161 B2 | 4/2007 | Vetrovec | |
| 7,317,741 B2 | 1/2008 | Klimek et al. | |
| 7,430,230 B2 | 9/2008 | Savich | |
| 7,433,376 B1 | 10/2008 | Mandl et al. | |
| 7,463,660 B2 | 12/2008 | Hackel et al. | |
| 7,477,674 B2 | 1/2009 | Vetrovec et al. | |
| 7,609,741 B2 | 10/2009 | Vetrovec | |
| 7,675,952 B2 | 3/2010 | Ushinsky et al. | |
| 7,830,946 B2 | 11/2010 | Erlandson et al. | |
| 7,894,496 B2 | 2/2011 | Hackel et al. | |
| 8,072,677 B2 | 12/2011 | Falcoz et al. | |
| 8,268,649 B2 | 9/2012 | Vetrovec | |
| 8,406,260 B2 | 3/2013 | Branly | |
| 8,483,255 B2 | 7/2013 | Bayramian et al. | |
| 8,682,125 B2 | 3/2014 | Bayramian et al. | |
| 8,687,270 B2 | 4/2014 | Manes et al. | |
| 8,774,235 B2 | 7/2014 | Stultz | |
| 2002/0039377 A1 | 4/2002 | Zapata et al. | |
| 2002/0080841 A1 | 6/2002 | Yin et al. | |
| 2002/0110164 A1 | 8/2002 | Vetrovec | |
| 2002/0118718 A1 | 8/2002 | Honea et al. | |
| 2002/0126715 A1 | 9/2002 | Gerstenberger et al. | |
| 2005/0249258 A1 | 11/2005 | Rothenberg et al. | |
| 2005/0254536 A1 | 11/2005 | Hackel et al. | |
| 2008/0156991 A1* | 7/2008 | Hu .................. | G01N 21/3151 250/341.1 |
| 2008/0175288 A1 | 7/2008 | Vetrovec | |
| 2009/0059977 A1 | 3/2009 | Hackel et al. | |
| 2010/0002740 A1 | 1/2010 | Ushinsky et al. | |
| 2010/0009475 A1 | 1/2010 | Vetrovec | |
| 2011/0286709 A1 | 11/2011 | Bayramian et al. | |
| 2012/0320937 A1 | 12/2012 | Branly | |
| 2012/0327962 A1 | 12/2012 | Stultz | |
| 2013/0215915 A1 | 8/2013 | Branly et al. | |
| 2014/0307305 A1 | 10/2014 | Deri et al. | |

FOREIGN PATENT DOCUMENTS

| | | |
|---|---|---|
| DE | 102012214970 A1 | 3/2014 |
| WO | 2010034811 A1 | 4/2010 |

* cited by examiner

APPARATUS AND METHOD FOR SUPPRESSING PARASITIC LASING AND APPLICATIONS THEREOF

GOVERNMENT FUNDING

This invention was made with government support under Award #1068604 awarded by the National Science Foundation; Agreement # W911NF-12-1-0456 awarded by the Army Research Office; and contract #W31P4Q1310017 awarded by DARPA. The government has certain rights in the invention.

RELATED APPLICATION DATA

None.

BACKGROUND

Embodiments and aspects generally pertain to the field of laser apparatus and methods; more particularly to improved laser amplifier operation and, most particularly to improved large-aperture, high-power, solid state amplifier operation via the embodied apparatus and methods disclosed herein below.

High power (terawatt (TW) and petawatt (PW)) lasers are advantageous for applications in, e.g., medical physics (e.g., proton sources for cancer therapy); particle physics (e.g., particle accelerators); and nuclear physics (e.g., fusion, weapons, plasma and x-ray sources). It has been reported that current demand is for 100 mm diameter (Ti:sapphire) crystals, which is projected to grow up to 250 mm diameter crystals in a few years. A PW laser pulse of 30 fs duration requires a pulse energy of 30 J, necessitating 30 $cm^2$ area of gain medium (e.g., Ti:sapphire). Beam clipping considerations thus dictate a Ti:sapphire crystal of the order of 10 cm diameter. Thus, large aperture Ti:sapphire amplifiers are a key requirement for the new PW class of ultrafast-ultrapowerful lasers.

Parasitic (or transverse) lasing in large-aperture, high-power, solid state amplifiers is a common problem that limits the final output power of the amplification process. Parasitic lasing occurs when the transverse gain exceeds the transverse losses caused by the Fresnel reflections at the edge of the gain medium, leading to transverse laser oscillations. For an untreated Ti:Sapphire crystal, for example, the Fresnel reflections are ~7% for an incident angle normal to a surface exposed to air, and as such the threshold of parasitic lasing occurs when the transverse gain reaches 15. At the onset of parasitic lasing, the energy stored in the amplifier can be quickly drained, which has the effect of clamping the gain available to the intended longitudinal amplification process.

Traditional methods for reducing parasitic lasing in solid state lasers involve the use of absorbing thin films, optical coatings, and index-matching approaches to reduce the possibility that ASE photons reaching the laser gain medium boundaries are reflected back into the medium. This can be accomplished, e.g., by cladding selected boundaries of the gain medium with material that efficiently absorbs incident ASE photons.

TW/PW lasers also require thermal management. Heat can ruin the beam, lead to component damage, and limit the repetition rate, problems whose solutions include operating at very low repetition rates, water cooling, and cryogenic cooling.

A shortcoming in the known art recognized by the inventors is the incompatibility of the absorbing thin films, optical coatings, and index-matching approaches in high-vacuum and/or cryogenic environments, which are too extreme for these traditional solutions. Previous index matching methods for suppressing transverse/parasitic lasing cannot be used in cryogenic and/or high-vacuum environments; may not permit tuning of the index of refraction for exact index matching or for adaptability to wide ranges of gain media; may not support tuning of the absorption profile of the index matching region.

The inventors have therefore recognized the advantages and benefits of overcoming the aforementioned shortcomings and incompatibilities by providing solutions for reducing parasitic lasing in high power lasers operating in high-vacuum and/or cryogenic environments using an index-matching approach as disclosed by the embodiments herein. The recognized advantages and benefits enabled by the disclosed and claimed embodiments include, but are not limited to, laser systems operating in cryogenic and/or high-vacuum environments, where previously no other index matching solutions have proven viable; laser systems already using index-matching methods, to which the benefits of cryogenic cooling (e.g., improved beam quality, ability to operate at a higher repetition rate or average power, etc.) or vacuum compatibility can now be extended; laser systems where a cladding/coating material with a tunable index of refraction is advantageous (e.g., cases where: a very specific refractive index is required; the gain medium has an uncommon refractive index; many different gain media used in a system could be supported by the same technique; etc.); and laser systems where a cladding/coating material with a tunable absorption is advantageous (e.g., gain media where careful thermal management is important).

An exemplary commercial use of the embodied invention is in high-power, solid state laser amplifiers (Ti:Sapphire, Nd:YAG etc.). Some suppliers offer high-power laser amplifiers with an anti-transverse-lasing solution but without the benefits of cryogenic cooling, while other suppliers offer high-power laser amplifiers with cryogenic cooling but without the possibility of index matching. The embodied solutions could be used as part of an amplifier capable of offering the benefits of both cryogenic cooling and anti-transverse lasing. Another potential use could be in a laser system that could benefit from index matching if other index matching methods are not convenient or available.

DEFINITIONS AND MEANINGS OF CERTAIN TERMS USED HEREIN

The term 'substantially' as it is used in or about the expression ' . . . the epoxy composition index of refraction that substantially matches the index of refraction of the gain medium' is presumed to be clearly understood by a person skilled in the art. As is appreciated, the better the index match, the better the ASE suppression; thus there is not a quantitative distinction between what 'works' and 'doesn't work.' If the index matching is within 5%, then the ASE reflections will be suppressed by >100 for many solid state crystals (the exact percentage needed to suppress by 100 depends on the crystal) compared to reflections from a bare/untreated surface, but this "100" is arbitrary rather than a standard of the field.

The terms 'low-temperature' and 'cryogenic' temperatures are presumed to be clearly understood by a person skilled in the art. The epoxy composition disclosed herein must function as intended at the level of the cryocooler component of the laser apparatus. Thus, the temperature for a cryocooled high-power laser system may range from several hundred Kelvin to near absolute zero, depending upon the expected thermal load on the laser crystal. A 'low temperature' less than or equal to 200 K would be understood to be appropriate at present since this is near the highest operating temperature of a cryocooler encountered by the inventors and also is near the sublimation point of $CO_2$; however, any temperature below freezing will cause frost issues that would need to be solved by vacuum, which solution is enabled by the embodied apparatus and method of index matching.

The terms 'large-aperture' and 'high-power' in the context of the instant disclosure and claimed subject matter are presumed to be clearly understood by a person skilled in the art. A pragmatic but non-limiting interpretation of these terms means 'in a region of sufficiently high power and large aperture where the transverse gain rivals or surpasses the transverse losses in magnitude, leading to the onset of parasitic lasing.' As is known, the transverse gain and losses themselves depend on the shape and material properties of the amplifier, the pumping power and pumping size, etc.

SUMMARY OF ASPECTS AND EMBODIMENTS

An aspect of the invention is a method to reduce and/or eliminate gain clamping in a solid state laser/amplifier apparatus. In an exemplary aspect, the method includes the steps of providing a solid state laser/amplifier apparatus including a gain medium having a known index of refraction for operation in an evacuated cryogenic environment; providing the gain medium having a perimetrical edge including an amplified spontaneous emission (ASE)-absorbing epoxy composition disposed on at least a portion of the perimetrical edge of the gain medium, wherein the epoxy composition has an index of refraction that substantially matches the index of refraction of the gain medium; and coupling out from the gain medium at least a portion of transversely propagating ASE so as to prevent a build-up of parasitic oscillations in the gain medium. In various embodiments, the method may include additional steps, features, and/or characteristics, alone or in various combinations, including but not limited to:

wherein the perimetrical edge of the gain medium is a diffuse surface;

wherein the ASE-absorbing epoxy composition has a thickness equal to or greater than 10 microns (μm) and equal to or less than 1 centimeter (cm);

further comprising disposing the gain medium including the ASE-absorbing epoxy composition disposed on at least a portion of the perimetrical edge of the gain medium on a cold finger of a cryorefrigerator;

providing a Ti:Sapphire gain medium;

wherein the ASE-absorbing epoxy composition is a mixture of Stycast 1266 and Stycast 2850 epoxy resins;

wherein the ASE-absorbing epoxy composition comprises at least two epoxy components each having a different index of refraction and combining the at least two epoxy components in a predetermined proportion to achieve the epoxy composition index of refraction that substantially matches the index of refraction of the gain medium;

wherein the epoxy composition index of refraction matches the index of refraction of the gain medium to within five percent;

wherein the at least two epoxy components are low temperature-compatible epoxy components;

wherein the low temperature is equal to or less than zero degrees centigrade;

wherein the low temperature is equal to or less than 200 Kelvin;

wherein the ASE-absorbing epoxy composition may include an ASE-absorbing optical dopant;

wherein the ASE-absorbing optical dopant consists of metal particles;

wherein the metal particles have sizes that are equal to or less than 10 μm;

wherein the ASE-absorbing optical dopant is selected from a group consisting of graphite, graphene, iron and powders absorbing near a gain crystal's ASE wavelength;

further comprising providing a bonding base intermediate the perimetrical edge of the gain medium and the ASE-absorbing epoxy composition, wherein the bonding base comprises a low-temperature epoxy;

wherein the bonding base further includes an optical dopant that enables at least one of refractive index tuning and ASE absorption tuning;

comprising adjusting the ASE-absorbing optical dopant level in the bonding base to control a thermal profile and ASE absorption profile of the solid state laser/amplifier apparatus;

wherein the optical dopant(s) for refractive index tuning and/or for ASE absorption is a powdered optical material;

wherein the optical dopant for refractive index tuning has a refractive index that is greater than a refractive index of the transparent, low-temperature epoxy of the bonding base;

wherein the bonding base is Stycast 1266 and the optical dopant for refractive index tuning is $SrTiO_3$.

wherein the optical dopant for ASE absorption consists of metal particles;

wherein the metal particles have sizes that are equal to or less than 10 μm;

wherein the ASE-absorbing optical dopant is selected from a group consisting of graphite, graphene, iron and powders absorbing near a gain crystal's ASE wavelength;

An aspect of the invention is a solid state laser/amplifier apparatus designed for operation in an evacuated, cryogenic environment. In an exemplary aspect, the apparatus includes a gain medium having a known index of refraction, wherein the gain medium has a perimetrical edge; and an amplified spontaneous emission (ASE)-absorbing epoxy composition disposed on at least a portion of the perimetrical edge of the gain medium, wherein the epoxy composition has an index of refraction that substantially matches the index of refraction of the gain medium, wherein the gain medium is characterized by a gain clamping parameter that is greater than a gain clamping parameter of a similar gain medium of a laser/amplifier apparatus designed for operation in an evacuated, cryogenic environment that does not include an ASE-absorbing epoxy composition disposed on at least a portion of the perimetrical edge of the gain medium, wherein the epoxy composition has an index of refraction that substantially matches the index of refraction of the gain medium. In various embodiments, the apparatus may include additional components, features, and/or characteristics, alone or in various combinations, including but not limited to:

wherein the perimetrical edge of the gain medium is a diffuse surface;

wherein the ASE-absorbing epoxy composition has a thickness equal to or greater than 10 microns (μm) and equal to or less than 1 centimeter (cm);

wherein the gain medium including the ASE-absorbing epoxy composition is disposed on a cold finger of a cryorefrigerator;

wherein the gain medium is a Ti:Sapphire crystal;

wherein the ASE-absorbing epoxy composition is a mixture of Stycast 1266 and Stycast 2850 epoxy resins;

wherein the ASE-absorbing epoxy composition comprises at least two epoxy components each having a different index of refraction, in a predetermined proportion to achieve the epoxy composition index of refraction that substantially matches the index of refraction of the gain medium;

wherein the at least two epoxy components are low temperature-compatible epoxy components;

wherein the ASE-absorbing epoxy composition includes an ASE-absorbing optical dopant;

wherein the ASE-absorbing optical dopant consists of metal particles;

wherein the metal particles have sizes that are equal to or less than 10 µm;

wherein the ASE-absorbing optical dopant is selected from a group consisting of graphite, graphene, iron and powders absorbing near a gain crystal's ASE wavelength;

further comprising a bonding base disposed intermediate the perimetrical edge of the gain medium and the ASE-absorbing epoxy composition, wherein the bonding base comprises at least a low-temperature epoxy;

wherein the bonding base further includes an optical dopant that enables at least one of refractive index tuning and ASE absorption tuning;

wherein an amount of the ASE-absorbing optical dopant level in the bonding base is sufficient to control a thermal profile and ASE absorption profile of the solid state laser/amplifier apparatus;

wherein the optical dopant(s) for refractive index tuning and for ASE absorption is a powdered optical material;

wherein the optical dopant for refractive index tuning has a refractive index that is greater than a refractive index of the transparent, low-temperature epoxy of the bonding base;

wherein the bonding base is Stycast 1266 and the optical dopant for refractive index tuning is $SrTiO_3$.

wherein the optical dopant for ASE absorption consists of metal particles;

wherein the metal particles have sizes that are equal to or less than 10 µm;

wherein the ASE-absorbing optical dopant is selected from a group consisting of graphite, graphene, iron and powders absorbing near a gain crystal's ASE wavelength;

DETAILED DESCRIPTION OF NON-LIMITING, EXEMPLARY EMBODIMENTS

Figure 2:
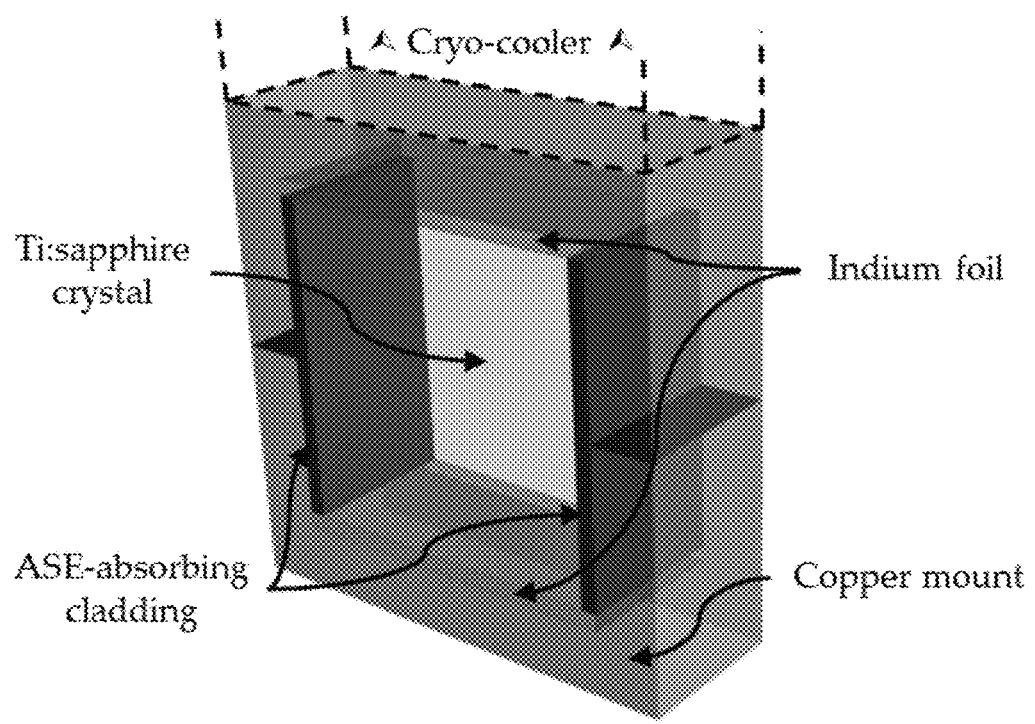
FIG. 2 is a schematic drawing of a rectangular laser gain medium having a perimetrical edge partially coated with an ASE-absorbing epoxy composition, disposed in a cryocooler, which assembly would be placed in an evacuated environment within a laser cavity, according to an illustrative, exemplary embodiment of the invention.

The disclosed embodiments describe apparatus and methods to avoid gain clamping in solid state lasers operating at cryogenic temperatures and/or in high vacuum environments by suppressing parasitic optical amplification. This is accomplished by bonding, or otherwise bringing into contact without a gap, a light-absorbing, refractive index-matched material (hereinafter 'ASE absorption material') to/with at least a portion of the edge or circumferential surface (hereinafter 'perimetrical edge') of the laser gain medium (see FIG. 2). The perimetrical edge of the gain medium will advantageously be ground and/or optically diffuse. The gain medium, typically in the form of a disc (although not necessarily round or of circular geometry) having such an ASE absorption material on at least a portion of its perimetrical edge allows the amplified spontaneous emission in the transverse direction to be coupled out to prevent parasitic oscillations from building up. The ASE absorption material reduces the strength of the Fresnel reflections and adds high absorption losses, both of which serve to increase the losses in the transverse direction, which prolongs the onset of parasitic lasing by increasing the threshold gain required to sustain transverse laser action.

The ASE absorption material is prepared with low temperature-compatible epoxies. In order to achieve an optical refractive index that closely matches the laser gain medium, different epoxies with high and low refractive indices are mixed together in predetermined proportions. Super-fine metal particles with absorption at ASE wavelengths may be added to the epoxy base to enhance the absorption capability.

For some high power applications, abrupt heat build-up at the boundary between the gain medium and the ASE absorption material can be a problem. To avoid this, a transparent, low-temperature epoxy mixed with a powdered optical material having a higher refractive index (for example, $SrTiO_3$) can be used as a bonding base. The thermal profile can thus be controlled by adjusting the ASE-absorbing dopant level in the bonding base.

Illustrative Example

In an exemplary embodiment, the ASE absorption material was a mixture of Stycast 1266 epoxy and Stycast 2850 epoxy, which was bonded to the ground/diffuse perimetrical edge surface of a Ti:Sapphire crystal (laser gain medium). These two cryogenic epoxies were combined in a 1:1 mix ratio resulting in a refractive index substantially equal to that of sapphire. The epoxy mixture layer thickness was on the order of 1 mm to avoid possible cracking caused by a mismatch between material thermal coefficients of the composite epoxy and sapphire.

Figure 1:
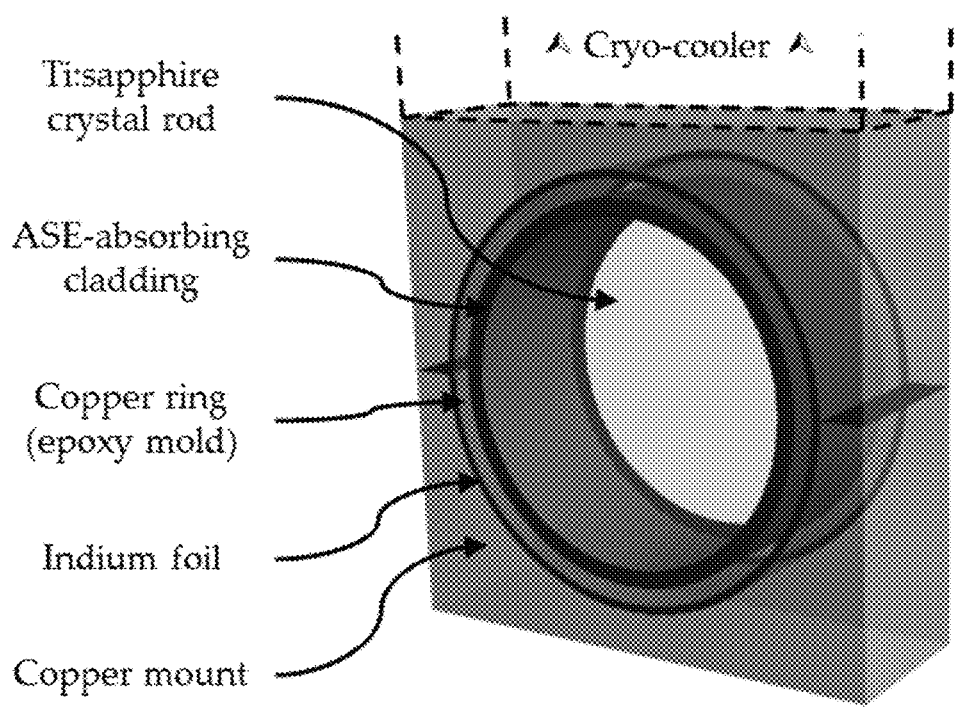
FIG. 1 is a schematic drawing of a cylindrical disc laser gain medium having a perimetrical edge entirely coated with an ASE-absorbing epoxy composition, disposed in a cryocooler, which assembly would be placed in an evacuated environment within a laser cavity, according to an illustrative, exemplary embodiment of the invention.

As is generally illustrated in FIG. 1, the ground edge of a cylindrical disc Ti:Sapphire crystal was in optical contact with the ASE absorption material made from 50:50 mixed Stycast 1266 and 2850. The thickness of the epoxy was controlled by placing the crystal inside a copper ring whose inner radius was larger than the crystal radius by an amount equal to the desired epoxy thickness. The outer circumferential edge of the copper ring was wrapped in indium foil before it was clamped in a copper mount, which attached to the cold finger of a pulse tube cryorefrigerator. The heat deposited by the pump laser was conducted out through the copper crystal mount. The entire assembly was cooled to a temperature of approximately 70 K and maintained under high vacuum during operation.

The ASE absorption treatment on the Ti:sapphire crystal edge is carried out as follows:

i. Carefully clean the ground edge of the crystal with isopropyl alcohol to remove oil and other contaminants;

ii. Prepare Stycast 1266 and Stycast 2850 according to the procedure recommended by the manufacturer;

iii. Mix Stycast 1266 and Stycast 2850 with a 1:1 ratio. Shake the mixture with a vortex mixer for over 5 min;

iv. Apply the mixture to the perimetrical edge of the crystal. A cavity mold (for example, a copper ring fitting the size of crystal) can be used to confine the mixture thickness applied around the crystal. A small amount of alcohol can be used to wet the side of the crystal before applying the epoxy mixture in order to realize good optical contact;

v. Wait 48 hours for the epoxy mixture to harden.

The embodied method enables (perfect) index matching for a broad range of materials because the index of refraction of the absorption layer can be effectively tuned (by using different proportions of two different types of epoxy, using a high-index powder in a low-index base, etc.). This differs from other index matching solutions offered in the past, as the lack of tunability excluded the possibility of exactly matching the index of refraction of the material of interest and/or the adaptability of the cladding to multiple materials. The embodied invention thus allows for index matching in cryogenic, high-vacuum environments—conditions that are too extreme for other index matching solutions. This is a crucial requirement for many high power and high energy laser systems.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

We claim:

1. A method to reduce and/or eliminate gain clamping in a solid state laser/amplifier apparatus, comprising:

providing a solid state laser/amplifier apparatus designed for operation in an evacuated, cryogenic environment, comprising:

a gain medium having a known index of refraction, having a perimetrical edge; and an amplified spontaneous emission (ASE)-absorbing epoxy composition disposed on at least a portion of the perimetrical edge of the gain medium, wherein the epoxy composition has an index of refraction that substantially matches the index of refraction of the gain medium, wherein the ASE-absorbing epoxy composition is a mixture of Stycast 1266 and Stycast 2850 epoxy resins, further wherein the gain medium is characterized by a gain clamping parameter that is greater than a gain clamping parameter of a similar gain medium of a laser/amplifier apparatus designed for operation in an evacuated, cryogenic environment that does not include an ASE-absorbing epoxy composition disposed on at least a portion of the perimetrical edge of the similar gain medium, wherein the epoxy composition has an index of refraction that substantially matches the index of refraction of the similar gain medium; and coupling out from the gain medium at least a portion of transversely propagating ASE so as to prevent a build-up of parasitic oscillations in the gain medium.

2. The method of claim 1, wherein the perimetrical edge of the gain medium is a diffuse surface.

3. The method of claim 1, wherein the ASE-absorbing epoxy composition has a thickness equal to or greater than 10 microns (μm) and equal to or less than 1 centimeter (cm).

4. The method of claim 1, further comprising disposing the gain medium including the ASE-absorbing epoxy composition disposed on at least a portion of the perimetrical edge of the gain medium in a cryorefrigerator.

5. The method of claim 1, comprising providing a Ti:Sapphire gain medium.

6. The method of claim 1, wherein the ASE-absorbing epoxy composition comprises at least two epoxy components each having a different index of refraction and combining the at least two epoxy components in a predetermined proportion to achieve the epoxy composition index of refraction that substantially matches the index of refraction of the gain medium.

7. The method of claim 6, wherein the epoxy composition index of refraction matches the index of refraction of the gain medium to within five percent.

8. The method of claim 6, wherein the at least two epoxy components are low temperature-compatible epoxy components.

9. The method of claim 8, wherein the low temperature is equal to or less than zero degrees centigrade.

10. The method of claim 8, wherein the low temperature is equal to or less than 200 Kelvin.

11. The method of claim 6, wherein the ASE-absorbing epoxy composition includes an ASE-absorbing optical dopant.

12. The method of claim 11, wherein the ASE-absorbing optical dopant consists of metal particles.

13. The method of claim 12, wherein the metal particles have sizes that are equal to or less than 10 μm.

14. The method of claim 11, wherein the ASE-absorbing optical dopant is selected from a group consisting of graphite, graphene, iron and powders absorbing near a gain crystal's ASE wavelength.

15. The method of claim 1, further comprising providing a bonding base intermediate the perimetrical edge of the gain medium and the ASE-absorbing epoxy composition, wherein the bonding base comprises a low-temperature epoxy.

16. The method of claim 15, wherein the bonding base further includes an optical dopant that enables at least one of refractive index tuning and ASE absorption.

17. The method of claim 16, comprising adjusting the index-tuning optical dopant level in the bonding base to tune the refractive index and adjusting the ASE-absorbing optical dopant level to control a thermal profile and ASE absorption profile of the solid state laser/amplifier apparatus.

18. The method of claim 16, wherein the optical dopant is a powdered optical material.

19. The method of claim 16, wherein the optical dopant has a refractive index that is greater than a refractive index of the transparent, low-temperature epoxy of the bonding base.

20. The method of claim 15, wherein the bonding base is Stycast 1266 and the optical dopant is $SrTiO_3$.

21. A solid state laser/amplifier apparatus designed for operation in an evacuated, cryogenic environment, comprising:

a gain medium having a known index of refraction, wherein the gain medium has a perimetrical edge; and an amplified spontaneous emission (ASE)-absorbing epoxy composition disposed on at least a portion of the perimetrical edge of the gain medium, wherein the epoxy composition has an index of refraction that substantially matches the index of refraction of the gain medium, wherein the ASE-absorbing epoxy composition is a mixture of Stycast 1266 and Stycast 2850 epoxy resins, further wherein the gain medium is characterized by a gain clamping parameter that is greater than a gain clamping parameter of a similar gain medium of a laser/amplifier apparatus designed for operation in an evacuated, cryogenic environment that does not include an ASE-absorbing epoxy composition disposed on at least a portion of the perimetrical edge of the similar gain medium, wherein the epoxy composition has an index of refraction that substantially matches the index of refraction of the similar gain medium.

22. The solid state laser/amplifier apparatus of claim 21, wherein the perimetrical edge of the gain medium is a diffuse surface.

23. The solid state laser/amplifier apparatus of claim 21, wherein the ASE-absorbing epoxy composition has a thickness equal to or greater than 10 microns (μm) and equal to or less than 1 centimeter (cm).

24. The solid state laser/amplifier apparatus of claim 21, wherein the gain medium including the ASE-absorbing epoxy composition is disposed on a cold finger of a cryorefrigerator.

25. The solid state laser/amplifier apparatus of claim 21, wherein the gain medium is a Ti:Sapphire crystal.

26. The solid state laser/amplifier apparatus of claim 21, wherein the ASE-absorbing epoxy composition comprises at least two epoxy components each having a different index of refraction, in a predetermined proportion to achieve the epoxy composition index of refraction that substantially matches the index of refraction of the gain medium.

27. The solid state laser/amplifier apparatus of claim 26, wherein the at least two epoxy components are low temperature-compatible epoxy components.

28. The solid state laser/amplifier apparatus of claim 26, wherein the ASE-absorbing epoxy composition includes an ASE-absorbing optical dopant.

29. The solid state laser/amplifier apparatus of claim 28, wherein the ASE-absorbing optical dopant consists of metal particles.

30. The solid state laser/amplifier apparatus of claim 29, wherein the metal particles have sizes that are equal to or less than 10 μm.

31. The solid state laser/amplifier apparatus of claim 29, wherein the ASE-absorbing optical dopant is selected from a group consisting of graphite, graphene, iron and powders absorbing near a gain crystal's ASE wavelength.

32. The solid state laser/amplifier apparatus of claim 21, further comprising a bonding base disposed intermediate the perimetrical edge of the gain medium and the ASE-absorbing epoxy composition, wherein the bonding base is a low-temperature epoxy.

33. The solid state laser/amplifier apparatus of claim 32, wherein the bonding base further includes an optical dopant that enables at least one of refractive index tuning and ASE absorption.

34. The solid state laser/amplifier apparatus of claim 33, wherein an amount of the optical dopant level in the bonding base is sufficient to control a thermal profile and ASE absorption profile of the solid state laser/amplifier apparatus.

35. The solid state laser/amplifier apparatus of claim 33, wherein the optical dopant is a powdered optical material.

36. The solid state laser/amplifier apparatus of claim 33, wherein the optical dopant has a refractive index that is greater than a refractive index of the low-temperature epoxy of the bonding base.

37. The solid state laser/amplifier apparatus of claim 33, wherein the bonding base is Stycast 1266 and the index-tuning optical dopant is $SrTiO_3$.

38. A solid state laser/amplifier apparatus designed for operation in an evacuated, cryogenic environment, comprising:
- a gain medium having a known index of refraction, wherein the gain medium has a perimetrical edge;
- an amplified spontaneous emission (ASE)-absorbing epoxy composition disposed on at least a portion of the perimetrical edge of the gain medium, wherein the epoxy composition has an index of refraction that substantially matches the index of refraction of the gain medium; and
- a bonding base disposed intermediate the perimetrical edge of the gain medium and the ASE-absorbing epoxy composition, wherein the bonding base is a low-temperature epoxy and wherein the bonding base further includes an optical dopant that enables at least one of refractive index tuning and ASE absorption, wherein the gain medium is characterized by a gain clamping parameter that is greater than a gain clamping parameter of a similar gain medium of a laser/amplifier apparatus designed for operation in an evacuated, cryogenic environment that does not include an ASE-absorbing epoxy composition disposed on at least a portion of the perimetrical edge of the similar gain medium, wherein the epoxy composition has an index of refraction that substantially matches the index of refraction of the similar gain medium.

39. The solid state laser/amplifier apparatus of claim 38, wherein an amount of the optical dopant level in the bonding base is sufficient to control a thermal profile and ASE absorption profile of the solid state laser/amplifier apparatus.

40. The solid state laser/amplifier apparatus of claim 38, wherein the optical dopant is a powdered optical material.

41. The solid state laser/amplifier apparatus of claim 38, wherein the optical dopant has a refractive index that is greater than a refractive index of the low-temperature epoxy of the bonding base.

42. The solid state laser/amplifier apparatus of claim 38, wherein the bonding base is Stycast 1266 and the index-tuning optical dopant is $SrTiO_3$.

43. The solid state laser/amplifier apparatus of claim 38, wherein the ASE-absorbing epoxy composition is a mixture of Stycast 1266 and Stycast 2850 epoxy resins.

44. The method of claim 1, wherein the gain medium is characterized by a gain clamping parameter of a similar gain medium of a laser/amplifier apparatus designed for operation in the evacuated cryogenic environment that does not include the ASE-absorbing epoxy composition disposed on at least a portion of the perimetrical edge of the similar gain medium, wherein the epoxy composition has an index of refraction that substantially matches the index of refraction of the similar gain medium.

* * * * *